US011720327B2

(12) United States Patent
Yu et al.

(10) Patent No.: US 11,720,327 B2
(45) Date of Patent: Aug. 8, 2023

(54) TEMPERATURE COMPENSATION CIRCUIT AND METHOD FOR NEURAL NETWORK COMPUTING-IN-MEMORY ARRAY

(71) Applicant: Jiangnan University, Wuxi (CN)

(72) Inventors: Zhiguo Yu, Wuxi (CN); Yanhang Liu, Wuxi (CN); Hongbing Pan, Wuxi (CN); Xiaofeng Gu, Wuxi (CN)

(73) Assignee: JIANGNAN UNIVERSITY, Wuxi (CN)

( * ) Notice: Subject to any disclaimer, the term of this patent is extended or adjusted under 35 U.S.C. 154(b) by 0 days.

(21) Appl. No.: 17/973,611

(22) Filed: Oct. 26, 2022

(65) Prior Publication Data

US 2023/0048640 A1 Feb. 16, 2023

Related U.S. Application Data

(63) Continuation of application No. PCT/CN2022/098349, filed on Jun. 13, 2022.

(30) Foreign Application Priority Data

Jun. 21, 2021 (CN) .......................... 202110688380.2

(51) Int. Cl.
*G06F 7/50* (2006.01)
*H03M 1/12* (2006.01)

(52) U.S. Cl.
CPC ................ *G06F 7/50* (2013.01); *H03M 1/12* (2013.01)

(58) Field of Classification Search
CPC .................................... G06F 7/50; H03M 1/12

USPC ......................................................... 708/200
See application file for complete search history.

(56) References Cited

U.S. PATENT DOCUMENTS

2003/0227790 A1  12/2003  Marr
2021/0019609 A1*  1/2021  Strukov ................ G11C 16/14
2021/0143828 A1   5/2021  Sarin et al.

FOREIGN PATENT DOCUMENTS

CN  106601290 A  4/2017
CN  112000170 A  11/2020
CN  113381759 A  9/2021

* cited by examiner

*Primary Examiner* — Tan V Mai
(74) *Attorney, Agent, or Firm* — IPro, PLLC; Na Xu

(57) ABSTRACT

The disclosure discloses a temperature compensation circuit and method for a neural network computing-in-memory array. Reference arrays sparsely inserted in the computing-in-memory array are adopted to provide a reference voltage for ADCs, so that an input voltage and a reference voltage of the ADCs have a same temperature coefficient. Finally, after analog-to-digital conversion by the ADC, the digital output of the ADC is not affected by the external temperature, thereby ensuring the operational precision of the neural network. According to the temperature compensation circuit of the disclosure, the reference arrays have the same structure as the computing-in-memory array. The insertion density of the reference arrays is related to the temperature field where the computing-in-memory arrays are located. One reference array may provide the reference voltage of the ADC for a plurality of computing-in-memory arrays, thereby minimizing the increase of area and power consumption caused by inserting the reference arrays.

10 Claims, 9 Drawing Sheets

TEMPERATURE COMPENSATION CIRCUIT AND METHOD FOR NEURAL NETWORK COMPUTING-IN-MEMORY ARRAY

TECHNICAL FIELD

The disclosure relates to a temperature compensation circuit and method for a neural network computing-in-memory array, belonging to the technical field of integrated circuits.

BACKGROUND

Neural networks have made significant progress in the fields of image classification, image recognition, autonomous driving, etc. Computing-in-memory technique based on floating-gate nonvolatile devices, which integrates the storage and computation of data by using device arrays, is suitable for the application scenario of large-scale data parallel computing such as neural networks. When the computing-in-memory array composed of floating-gate nonvolatile devices works, the weights can be stored by changing the threshold voltage of the floating-gate devices in the computing-in-memory array, and finally the multiply-accumulate operation of the input data and the weights can be realized by subtraction of output currents of two rows of floating-gate devices working in the linear region in the computing-in-memory array. The difference between the output currents of the two rows of floating-gate devices after flowing through the current subtractor circuit represents the operational result.

The working process of the computing-in-memory array is as follows. After the multiply-accumulate operation of the array and the current subtraction are completed, the output current is:

$$I_{OUT} = \mu C_{ox} \frac{W}{L} \sum_{i=1}^{n} (\Delta V_{THi} V_{DSi});$$

$\mu$ is the mobility of the floating-gate devices, $C_{ox}$ is the capacitance of the gate oxide layer per unit area, W and L are the width and length of the floating-gate device, $\Delta V_{THi}$ is the threshold voltage difference, n is the weight and amount of input data, $$\mu C_{ox} \frac{W}{L} \Delta V_{THi}$$

is the i-th weight, and $V_{DSi}$ is the analog voltage signal obtained by converting the i-th input data through a DAC (digital-to-analog converter).

$I_{OUT}$ is subjected to I-V (current-voltage) conversion to obtain the output voltage:

$$V_{OUT} = \mu C_{ox} R \frac{W}{L} \sum_{i=1}^{n} (\Delta V_{THi} V_{DSi});$$

R is the I-V conversion resistor. Finally, $V_{OUT}$ is converted by an ADC (analog-to-digital converter) system composed of an external reference supply $V_{REF}$, a voltage buffer and an ADC into output data for further transmission.

When the computing-in-memory array works, the value of the output current of the array determines the operation result of the neural network. If the output current deviates, the output result of the ADC will also deviate, which will reduce the working accuracy of the whole neural network after transfer and amplification through multiple layers. In the expression of $I_{OUT}$, $\Delta V_{THi}$ itself has eliminated the influence of the linear temperature characteristic of the threshold voltage of the devices on the output current of the array. However, the mobility $\mu$ of the devices varies with the temperature. The mobility refers to the average drift velocity of carriers (electrons or holes) generated per unit electric field intensity. At different temperatures, the drift velocity of carriers will change, which leads to a nearly 50% change of $\mu$ in the range of 0° C.-100° C. (see "JIANG Mingfeng, FANG Yi, HUANG Lu, A Temperature-Compensated Vector-Matrix Multiplier Based on Flash Memory, [J]. Microelectronics, 2020, 50(3):344-348."). This means that the output current $I_{OUT}$ of the array will deviate by nearly 50% in the worst case, which has a non-negligible impact on the working accuracy of the neural network. Therefore, in order to make the neural network adapt to the change of ambient temperature, it is necessary to perform temperature compensation by eliminating the temperature drift characteristic of the mobility of the computing-in-memory devices.

In the article, JIANG Mingfeng et al. propose a temperature compensation circuit, which uses operational amplifiers, floating-gate devices and resistors to form a conductive load to directly obtain a temperature-independent output voltage $V_{OUT}$ at the output. However, the use of a large number of operational amplifiers in this method increases the power consumption of the neural network, and the time required for the operational amplifiers to reach the steady state also restricts the operational speed of the neural network. With the continuous expansion of the scale of the computing-in-memory array, 3D stacking technology that places the device array and the peripheral circuits of the array in different layers has emerged to meet the demand of development of neural networks towards large scale and high computing power. However, the compensation method in this article requires the compensation circuit and the computing-in-memory array to be in the same process layer, and this requirement cannot be satisfied in actual applications.

Researchers at the University of California, Santa Barbara in the USA have also proposed a temperature compensation method, which uses the subthreshold current characteristic of the device itself to avoid the influence of the mobility and threshold voltage to temperature on the multiplier, and uses the subtraction of currents of two rows to eliminate the temperature characteristic of threshold voltage (see "Temperature-insensitive analog vector-by-matrix multiplier based on 55 nm NOR flash memory cells," 2017 IEEE Custom Integrated Circuits Conference (CICC), Austin, Tex., USA, 2017, pp. 1-4.). However, the temperature compensation method based on the subthreshold characteristic of the device itself in this article leads to an extremely low output current of the array, even on the magnitude of picoamperes ($10^{-12}$ A), which greatly reduces the operational speed of the neural network and makes the neural network susceptible to noise, thereby reducing the operational accuracy of the neural network.

SUMMARY

In view of the above defects in the prior art, the disclosure provides a temperature compensation circuit and method for a neural network computing-in-memory array. The method can realize temperature compensation by eliminating temperature drift characteristic of mobility of the floating-gate devices, which only compensates for the digital output of the ADC, instead of aiming at the output current of the computing-in-memory array and the converted voltage. In the disclosure, the reference arrays sparsely inserted in the computing-in-memory array are adopted to provide the reference voltage for the ADCs, so that the input voltage and the reference voltage of the ADCs have the same temperature coefficient. Finally, after the analog-to-digital conversion by the ADC, the digital output of the ADC is not affected by the external temperature, thereby ensuring the operational precision of each layer of network.

According to the disclosure, the reference arrays in the temperature compensation circuit, which have the same structure as the computing-in-memory array and each include two rows of floating-gate devices, are used to complete the multiply-accumulate operation. The insertion density of the reference arrays is related to the temperature field where the computing-in-memory arrays are located. One reference array may provide the reference voltage of the ADC for a plurality of computing-in-memory arrays, thereby minimizing the increase of area and power consumption caused by inserting the reference arrays. The temperature compensation method in the disclosure is suitable for 3D stacking technology that places the device array and peripheral circuits of the array in the same layer or different layers, so that the computing-in-memory arrays can develop towards large scale.

For a neural network computing-in-memory array composed of N-type floating-gate devices, the temperature compensation circuit in the disclosure, as shown in FIG. 2, includes a reference array composed of two rows of N-type floating-gate devices for storing weights, a current subtractor circuit and an I-V conversion resistor $R_1$.

The two rows of N-type floating-gate devices for storing weights respectively include n N-type floating-gate devices $MR_{1+}$-$MR_{n+}$ and n N-type floating-gate devices $MR_{1-}$-$MR_{n-}$. In the reference array, gates of the n N-type floating-gate devices $MR_{1+}$-$MR_{n+}$ are connected to a same fixed voltage $V_{GS}$, drains are connected to a same fixed voltage $V_{DS}$, and sources are connected with each other and to a fixed voltage $V_S$ and connected into a positive input end of the current subtractor circuit. In the reference array, gates of the n N-type floating-gate devices $MR_{1-}$-$MR_{n-}$ are connected to the same fixed voltage $V_{GS}$, drains are connected to the same fixed voltage $V_{DS}$, and sources are connected with each other and to the fixed voltage $V_S$ and connected into a negative input end of the current subtractor circuit.

An output end of the subtractor circuit is connected to one end of the I-V conversion resistor $R_1$, and connected through a voltage buffer into a reference end of the analog-to-digital converter (ADC) connected with the computing-in-memory array. The other end of the I-V conversion resistor $R_1$ is grounded.

The I-V conversion resistor $R_1$ has same parameters as an I-V conversion resistor $R_0$ in a readout circuit of the computing-in-memory array.

Optionally, the neural network computing-in-memory array is composed of n N-type floating-gate devices $M_{1+}$-$M_{n+}$ and n N-type floating-gate devices $M_{1-}$-$M_{n-}$. The readout circuit of the computing-in-memory array includes one subtractor circuit, one I-V conversion resistor $R_0$ and the analog-to-digital converter (ADC).

In the neural network computing-in-memory array, gates of the n N-type floating-gate devices $M_{1+}$-$M_{n+}$ are respectively connected to voltages $V_{GS1}$-$V_{GSn}$, drains are respectively connected to input voltages $V_{DS1}$-$V_{DSn}$, and sources are connected with each other and to the fixed voltage $V_S$, and connected into the positive input end of the current subtractor circuit. Gates of the n N-type floating-gate devices $M_{1-}$-$M_{n-}$ are respectively connected to the voltages $V_{GS1}$-$V_{GSn}$, drains are respectively connected to the voltages $V_{DS1}$-$V_{DSn}$, and sources are connected with each other and to the fixed voltage $V_S$, and connected into the negative input end of the current subtractor circuit.

An output end of the current subtractor circuit is connected to one end of the I-V conversion resistor $R_0$ and connected into a data input end of the analog-to-digital converter (ADC). The other end of the I-V conversion resistor $R_0$ is grounded.

The current subtractor circuit is configured to perform a subtraction operation on an input current of the positive input end and an input current of the negative input end.

For a neural network computing-in-memory array composed of P-type floating-gate devices, the temperature compensation circuit in the disclosure, as shown in FIG. 3, includes a reference array composed of two rows of P-type floating-gate devices for storing weights, a current subtractor circuit and an I-V conversion resistor $R_1$.

The two rows of P-type floating-gate devices for storing weights respectively include n P-type floating-gate devices $MR_{1+}$-$MR_{n+}$ and n P-type floating-gate devices $MR_{1-}$-$MR_{n-}$. In the reference array, gates of the n P-type floating-gate devices $MR_{1+}$-$MR_{n+}$ are connected to a same fixed voltage $V_{GS}$, drains are connected to a same fixed voltage $V_{DS}$, and sources are connected with each other and to a fixed voltage $V_S$ and connected into a positive input end of the current subtractor circuit. In the reference array, gates of the n P-type floating-gate devices $MR_{1-}$-$MR_{n-}$ are connected to the same fixed voltage $V_{GS}$, drains are connected to the same fixed voltage $V_{DS}$, and sources are connected with each other and to the fixed voltage $V_S$ and connected into a negative input end of the current subtractor circuit.

An output end of the subtractor circuit is connected to one end of the I-V conversion resistor $R_1$, and connected through a voltage buffer into a reference end of the analog-to-digital converter connected with the computing-in-memory array. The other end of the I-V conversion resistor $R_1$ is grounded.

The I-V conversion resistor $R_1$ has same parameters as an I-V conversion resistor $R_0$ in a readout circuit of the computing-in-memory array.

Optionally, the neural network computing-in-memory array is composed of n P-type floating-gate devices $M_{1+}$-$M_{n+}$ and n P-type floating-gate devices $M_{1-}$-$M_{n-}$. The readout circuit of the computing-in-memory array includes one subtractor circuit, one I-V conversion resistor $R_0$ and the analog-to-digital converter (ADC).

In the neural network computing-in-memory array, gates of the n P-type floating-gate devices $M_{1+}$-$M_{n+}$ are respectively connected to voltages $V_{GS1}$-$V_{GSn}$, drains are respectively connected to input voltages $V_{DS1}$-$V_{DSn}$, and sources are connected with each other and to the fixed voltage $V_S$, and connected into the positive input end of the current subtractor circuit. Gates of the n P-type floating-gate devices $M_{1-}$-$M_{n-}$ are respectively connected to the voltages $V_{GS1}$-$V_{GSn}$, drains are respectively connected to the voltages $V_{DS1}$-$V_{DSn}$, and sources are connected with each other and to the fixed voltage $V_S$, and connected into the negative input end of the current subtractor circuit.

An output end of the current subtractor circuit is connected to one end of the conversion resistor $R_0$ and connected into a data input end of the analog-to-digital converter (ADC). The other end of the conversion resistor $R_0$ is grounded.

The current subtractor circuit is configured to perform a subtraction operation on an input current of the positive input end and an input current of the negative input end.

The disclosure further provides a temperature compensation method for a neural network computing-in-memory array, which is applicable to both the temperature compensation circuit for a computing-in-memory array composed of N-type floating-gate devices and the temperature compensation circuit for a computing-in-memory array composed of P-type floating-gate devices. The method includes the following steps:

step I: determining the number and position of reference arrays according to temperature field distribution of the computing-in-memory array in actual work;

step II: calculating a gate voltage $V_GS$, a drain voltage $V_{DS}$ and a threshold voltage difference $\Delta V_{TH}$ of floating-gate devices $MR_{1+}$-$MR_{n+}$ and $MR_{1-}$-$MR_{n-}$ in the reference array according to values of a reference voltage and a resistor $R_1$ required by the analog-to-digital converter;

step III: inputting the gate voltage $V_GS$ and the drain voltage $V_{DS}$ from the outside into gates and drains of the devices according to the calculation result of step II, and regulating a threshold voltage $V_{TH}$ of the devices to obtain the threshold voltage difference $\Delta V_{TH}$ calculated in step II; and step IV: enabling the reference array to generate a reference current $I_{REF}$ according to the operation of step III; and converting the reference current $I_{REF}$ into the reference voltage $V_{REF}$ of the analog-to-digital converter by the resistor $R_1$.

According to the temperature compensation method of the disclosure, optionally, the reference array and the computing-in-memory array are located in a same temperature field, and the current $I_{REF}$ generated after the operation of the reference array and a current $I_{OUT}$ generated after the operation of the computing-in-memory array change in a same proportion, so that a ratio of the input voltage to the reference voltage of the analog-to-digital converter before and after the temperature change remains unchanged, so as to ensure the correctness of output data of the analog-to-digital converter.

According to the temperature compensation method of the disclosure, optionally, one reference array is adopted to provide the reference voltage for the analog-to-digital converters connected to all the computing-in-memory arrays in the same temperature field. Further optionally, a plurality of reference arrays may be adopted according to the load of a current load circuit.

According to the temperature compensation method of the disclosure, optionally, the reference array is inserted in the middle of all the computing-in-memory arrays in the same temperature field.

According to the temperature compensation method of the disclosure, optionally, the reference array generates a constant current to provide the constant reference voltage for the analog-to-digital converter when working normally, and regulates the gate voltage $V_{GS}$ to turn off the devices in the reference array when not working, thereby reducing the power consumption.

According to the temperature compensation method of the disclosure, optionally, the reference array in the same temperature field as the computing-in-memory arrays is adopted to provide the reference voltage for the analog-to-digital converters connected to the computing-in-memory arrays, so as to compensate for temperature drift characteristic of mobility of the N-type or P-type floating-gate devices in the computing-in-memory arrays.

According to the temperature compensation circuit and method of the disclosure, optionally, the gate voltage of the floating-gate devices in the reference array may be controlled to determine whether the reference array works or not, and the reference array does not generate the reference current $I_{REF}$ when not working.

According to the temperature compensation circuit and method of the disclosure, since the working principle of the ADC is to calculate the ratio of the input voltage to the reference voltage, in the temperature compensation circuit and method of the disclosure and the current $I_{REF}$ generated after the operation of the reference array and the current $I_{OUT}$ generated after the operation of the computing-in-memory array located in the same temperature field as the reference array change in the same proportion, so that the ratio of the input voltage to the reference voltage before and after the temperature change remains unchanged, so as to ensure the correctness of output data of the ADC and also ensure the correctness of data transfer between the arrays.

According to the temperature compensation circuit and method of the disclosure, the temperature compensation is performed not by directly aiming at the output current of the array or the converted output voltage, but by eliminating the temperature drift characteristic of mobility of the floating-gate devices to realize temperature compensation in a way that the reference array provides the reference voltage for the ADCs to make the digital output of the ADCs not affected by the change of the external temperature.

According to the temperature compensation circuit and method of the disclosure, since it is only required to make $I_{REF}$ and $I_{OUT}$ change in the same proportion, there is no limit to the position of the peripheral circuits of the array, so that the current subtractor circuit and the peripheral circuits can be located in a different layer or a different temperature field from the device array.

The disclosure has the following beneficial effects:

According to the temperature compensation circuit and method of the disclosure, one reference array may provide the reference voltage of the ADC for a plurality of computing-in-memory arrays located in the same temperature field, thereby minimizing the increase of area and power consumption caused by inserting the reference arrays. The temperature compensation method in the disclosure is suitable for 3D stacking technology that places the device array and peripheral circuits of the array in the same layer or different layers, so that the computing-in-memory arrays can develop towards large scale.

According to the temperature compensation circuit and method of the disclosure, compared with the prior art, in the aspect of compensation accuracy, in the temperature compensation circuit and method of the disclosure, the reference array is added to the computing-in-memory array to provide the reference voltage for the ADCs, so that the temperature drift characteristic of mobility of devices can be eliminated accurately; in the aspect of power consumption, the neural network computing-in-memory for temperature compensation adopts the temperature compensation circuit and method of the disclosure, there is no need to add a large number of operational amplifiers, the power consumption generated by one reference array and peripheral circuits is close to that generated by one ordinary operational amplifier, and the number of the reference arrays adopted is much smaller than the number of operational amplifiers required in the prior art, so that the power consumption can be reduced greatly; and in the aspect of area, the area of the reference array and peripheral circuits added by the temperature compensation circuit of the disclosure is almost negligible relative to the area of the computing-in-memory arrays, and in the compensation method, except the reference array, the other peripheral circuits can all be located in a different process layer from the computing-in-memory arrays, thereby reducing the area and making the computing-in-memory neural network develop towards large scale, high computing power and high energy efficiency ratio.

BRIEF DESCRIPTION OF FIGURES

In order to more clearly illustrate the technical solutions in the embodiments of the disclosure, the accompanying drawings required in the description of the embodiments will be briefly described below. Apparently, the accompanying drawings in the description below are only some embodiments of the disclosure, and those of ordinary skill in the art can obtain other accompanying drawings according to these drawings without any creative work.

DETAILED DESCRIPTION

The implementations of the disclosure will be described clearly and completely with reference to the schematic diagrams of the disclosure below. Apparently, the implementations described are only a part of the implementations of the disclosure. All other implementations obtained by others in the art without creative work based on the implementations in the disclosure shall fall into the scope of the disclosure.

Embodiment I

Figure 1:
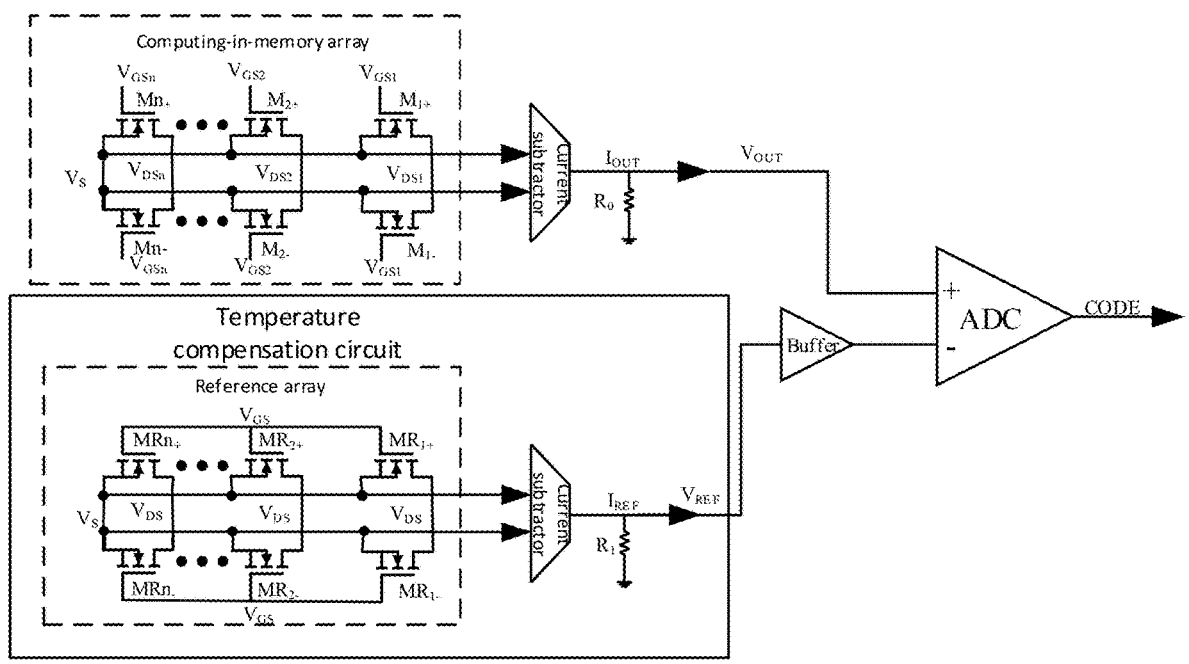
FIG. 1 is a schematic structural diagram of a temperature compensation circuit based on N-type floating-gate devices according to the disclosure.
Figure 2:
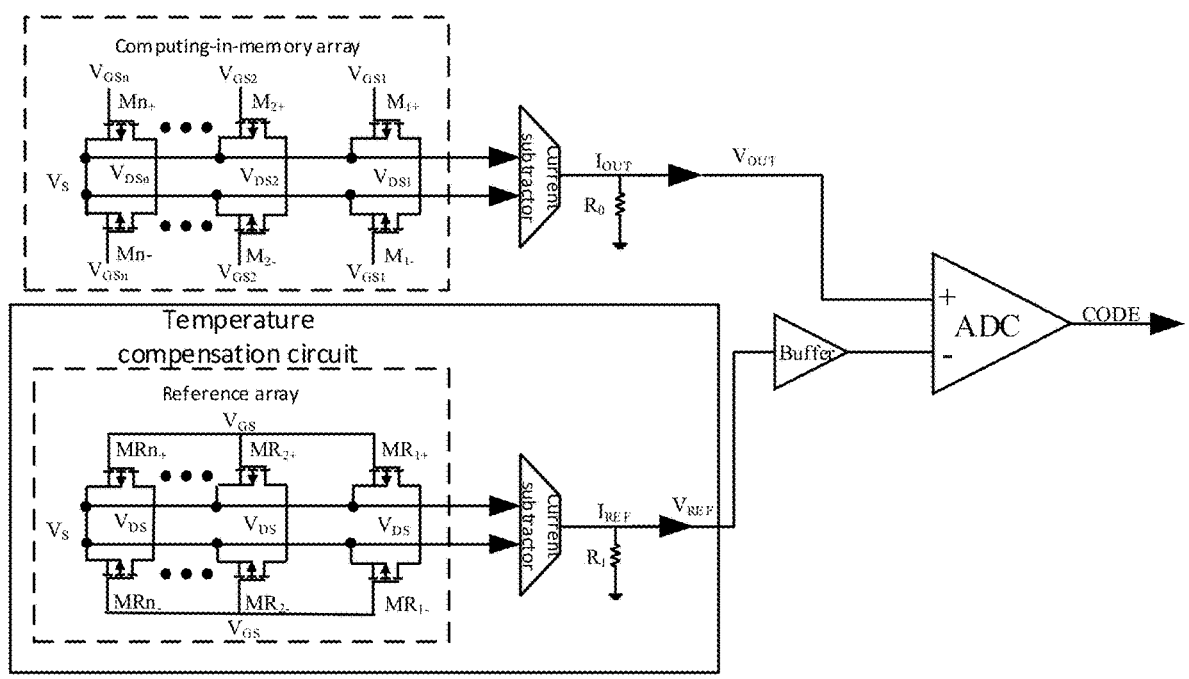
FIG. 2 is a schematic structural diagram of a temperature compensation circuit based on P-type floating-gate devices according to the disclosure.
Figure 3:
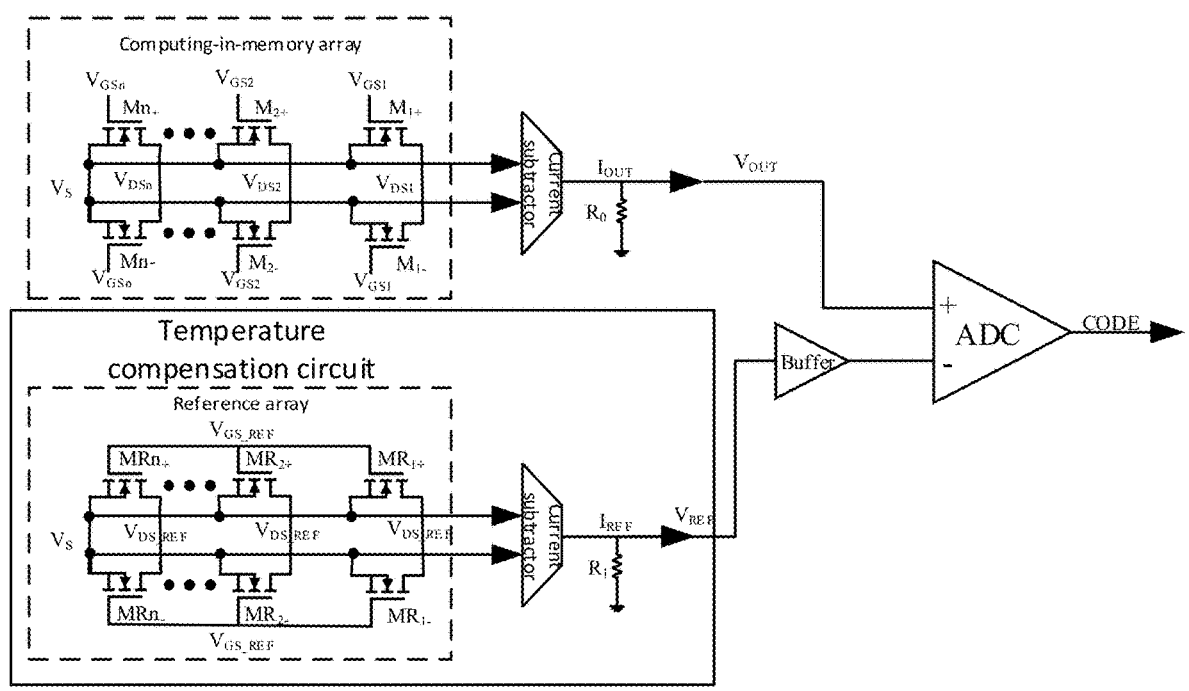
FIG. 3 is a schematic structural diagram of a temperature compensation circuit based on N-type floating-gate devices according to Embodiment I of the disclosure.

This embodiment provides a temperature compensation circuit, configured to perform temperature compensation on a neural network computing-in-memory array composed of N-type floating-gate devices. As shown in FIG. 3, the neural network computing-in-memory array is composed of n N-type floating-gate devices $M_{1+}$-$M_{n+}$ and n N-type floating-gate devices $M_{1-}$-$M_{n-}$. Gates of the n N-type floating-gate devices $M_{1+}$-$M_{n+}$ are respectively connected to voltages $V_{GS1}$-$V_{GSn}$, drains are respectively connected to input voltages $V_{DS1}$-$V_{DSn}$, and sources are connected with each other and to a fixed voltage $V_S$, and connected into a positive input end of a current subtractor circuit. Gates of the n N-type floating-gate devices $M_{1-}$-$M_{n-}$ are respectively connected to the voltages $V_{GS1}$-$V_{GSn}$, drains are respectively connected to the voltages $V_{DS1}$-$V_{DSn}$, and sources are connected with each other and to the fixed voltage $V_S$, and connected into a negative input end of the current subtractor circuit. The current subtractor circuit is configured to perform a subtraction operation on an input current of the positive input end and an input current of the negative input end. An output end of the current subtractor circuit is connected to one end of the conversion resistor $R_0$ and connected into an input end of the analog-to-digital converter (ADC). The other end of the conversion resistor $R_0$ is grounded.

The temperature compensation circuit includes: a reference array, a current subtractor circuit and an I-V conversion resistor $R_1$. The reference array includes two (one positive and one negative) rows of floating-gate devices. One row of floating-gate devices includes n N-type floating-gate devices $MR_{1+}$-$MR_{n+}$, and the other row of floating-gate devices includes n N-type floating-gate devices $MR_{1-}$-$MR_{n-}$.

As shown in FIG. 3, in the reference array, gates of the n N-type floating-gate devices $MR_{1+}$-$MR_{n+}$ are connected to a same fixed voltage $V_{GS\_REF}$, drains are connected to a same fixed voltage $V_{DS\_REF}$, and sources are connected with each other and to a fixed voltage $V_{DS\_REF}$ and connected into a positive input end of the current subtractor circuit. In the reference array, gates of the n N-type floating-gate devices $MR_{1-}$-$MR_{n-}$ are connected to the same fixed voltage $V_{GS\_REF}$, drains are connected to the same fixed voltage $V_{DS\_REF}$, and sources are connected with each other and to the fixed voltage $V_S$ and connected into a negative input end of the current subtractor circuit. An output end of the subtractor circuit is connected to one end of the resistor $R_1$, and connected through a voltage buffer into a reference end of the analog-to-digital converter (ADC). The other end of the resistor $R_1$ is grounded. The resistor $R_1$ has same parameters as an I-V conversion resistor $R_0$ in a readout circuit of the computing-in-memory array.

The readout circuit of the computing-in-memory array includes one subtractor circuit, one I-V conversion resistor $R_0$ and the analog-to-digital converter (ADC).

This embodiment further provides a temperature compensation method for a neural network computing-in-memory array, which is used for realizing the temperature compensation circuit for a computing-in-memory array composed of N-type floating-gate devices. The method includes the following steps:

Step I: Determine the number and position of reference arrays according to temperature field distribution of the computing-in-memory array in actual work.

Figure 6:
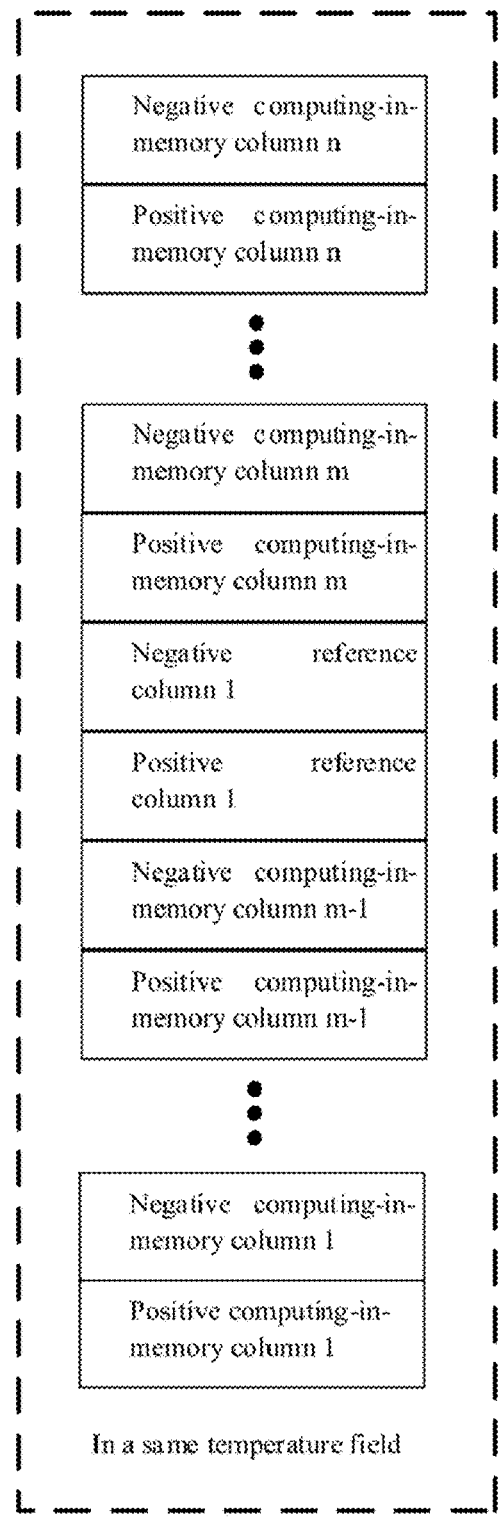
FIG. 6 is a schematic diagram showing the positional relationship when one reference array corresponds to a plurality of neural network computing-in-memory arrays according to the disclosure.

If the computing-in-memory arrays in computing-in-memory equipment are located in the same temperature field, then one reference array is arranged in the temperature field. If the temperature field contains a plurality of computing-in-memory arrays, the reference array may be arranged in the middle of all the computing-in-memory arrays, as shown in FIG. 6.

If the computing-in-memory arrays in the computing-in-memory equipment are located in a plurality of temperature fields, then one reference array is arranged for each temperature field.

Step II: Calculate a gate voltage $V_{GS\_REF}$, a drain voltage $V_{DS\_REF}$ and a threshold voltage difference $\Delta V_{THN\_REF}$ of floating-gate devices $MR_{1+}$-$MR_{n+}$ and $MR_{1-}$-$MR_{n-}$ in the reference array according to values of a reference voltage and a resistor $R_1$ required by the analog-to-digital converter.

Step III: Input the gate voltage $V_{GS\_REF}$ and the drain voltage $V_{DS\_REF}$ from the outside into gates and drains of the devices according to the calculation result of step II, and regulate a threshold voltage $V_{TH}$ of the devices by programming and erasing operations to obtain the threshold voltage difference $\Delta V_{THN\_REF}$ calculated in step II.

Step IV: Enable the reference array to generate a reference current $I_{REF}$ according to the operation of step III; and convert the reference current $I_{REF}$ into the reference voltage $V_{REF}$ of the analog-to-digital converter by the resistor $R_1$.

The reference current $I_{REF}$ generated by the reference array is converted by the resistor $R_1$ into the reference voltage $V_{REF}$ of the analog-to-digital converter.

According to the temperature compensation method of this embodiment, the reference array and the computing-in-memory array are located in the same temperature field, and the current $I_{REF}$ generated after the operation of the reference array and a current $I_{OUT}$ generated after the operation of the computing-in-memory array change in a same proportion, so that a ratio of the input voltage to the reference voltage of the analog-to-digital converter before and after the temperature change remains unchanged, so as to ensure the correctness of output data of the analog-to-digital converter.

The specific working process of the temperature compensation circuit of this embodiment is as follows:

In a non-readout mode, the gate voltage $V_{GS\_REF}$ of all the floating-gate devices in the reference array are grounded, and at this time, no current is output from the reference array.

In a readout mode, the weights stored in the two rows of floating-gate devices in the computing-in-memory array are $\Delta V_{THN1}$-$\Delta V_{THNn}$, the weights stored in the two rows of floating-gate devices in the reference array are all $\Delta V_{THN\_REF}$, and the computing-in-memory array obtains a corresponding output current $I_{OUT}$ through the subtractor circuit:

$$I_{OUT} = \mu_N C_{ox} \frac{W}{L}(\Delta V_{THN1} V_{DS1} + \Delta V_{THN2} V_{DS2} + \ldots + \Delta V_{THNn} V_{DSn})$$

$\mu N$ is the mobility of all the N-type floating-gate devices, $C_{ox}$ is the capacitance of the gate oxide layer, and W and L are respectively the width and length of the floating-gate device.

The output current $I_{OUT}$ is subjected to I-V conversion to obtain a corresponding output voltage $V_{OUT}$:

$$V_{OUT} = \mu_N C_{ox} \frac{W}{L} R_0 (\Delta V_{THN1} V_{DS1} + \Delta V_{THN2} V_{DS2} + \ldots + \Delta V_{THNn} V_{DSn});$$

The reference array obtains a reference current $I_{REF}$ through the subtractor circuit:

$$I_{REF} = n\mu_N C_{ox} \frac{W}{L}(\Delta V_{THN\_REF} V_{DS\_REF}),$$

The reference current $I_{REF}$ is subjected to I-V conversion to obtain a reference voltage $V_{REF}$:

$$V_{REF} = n\mu_N C_{ox} \frac{W}{L} R_1 (\Delta V_{THN\_REF} V_{DS\_REF}),$$

Assuming that the ADC is an m-bit ADC, then the ADC outputs the digital result:

$$\text{CODE} = V_{OUT}/V_{REF}) \times$$
$$(2^m - 1) = [(\Delta V_{THN1} V_{DS1} + \Delta V_{THN2} V_{DS2} + \ldots \Delta V_{THNn} V_{DSn})/$$
$$n(\Delta V_{THN\_REF} V_{DS\_REF})] \times (2^m - 1),$$

as can be seen, the formula of the digital result output by the ADC does not contain any parameter related to temperature characteristic, so that the digital output of the ADC will not change with the temperature. That is, the temperature compensation method in the disclosure eliminates the temperature drift characteristic of the N-type floating-gate devices.

According to the temperature compensation method of this embodiment, one reference array is adopted to provide the reference voltage for the analog-to-digital converters connected to all the computing-in-memory arrays in the same temperature field, and a plurality of reference arrays may also be adopted according to the load of a current load circuit.

According to the temperature compensation method of this embodiment, the reference array is inserted in the middle of all the computing-in-memory arrays in the same temperature field.

According to the temperature compensation method of this embodiment, optionally, the reference array generates a constant current to provide the constant reference voltage for the analog-to-digital converter when working normally, and regulates the gate voltage $V_{GS}$ to turn off the devices in the reference array when not working, thereby reducing the power consumption.

According to the temperature compensation method of this embodiment, optionally, the reference array in the same temperature field as the computing-in-memory arrays is adopted to provide the reference voltage for the analog-to-digital converters connected to the computing-in-memory arrays, so as to compensate for temperature drift characteristic of mobility of the N-type floating-gate devices in the computing-in-memory arrays.

According to the temperature compensation circuit and method of this embodiment, the gate voltage of the floating-gate devices in the reference array may be controlled to determine whether the reference array works or not, and the reference array does not generate the reference current $I_{REF}$ when not working.

According to the temperature compensation circuit and method of this embodiment, since the working principle of the ADC is to calculate the ratio of the input voltage to the reference voltage, in the temperature compensation circuit and method of the disclosure and the current $I_{REF}$ generated after the operation of the reference array and the current $I_{OUT}$ generated after the operation of the computing-in-memory array located in the same temperature field as the reference array change in the same proportion, so that the ratio of the input voltage to the reference voltage before and after the temperature change remains unchanged, so as to ensure the correctness of output data of the ADC and also ensure the correctness of data transfer between the arrays.

According to the temperature compensation circuit and method of this embodiment, the temperature compensation is performed not by directly aiming at the output current of the array or the converted output voltage, but by eliminating the temperature drift characteristic of mobility of the floating-gate devices to realize temperature compensation in a way that the reference array provides the reference voltage for the ADCs to make the digital output of the ADCs not affected by the change of the external temperature.

According to the temperature compensation circuit and method of this embodiment, since it is only required to make $I_{REF}$ and $I_{OUT}$ change in the same proportion, there is no limit to the position of the peripheral circuits of the array, so that the current subtractor circuit and the peripheral circuits can be located in a different layer or a different temperature field from the device array.

Embodiment II

Figure 4:
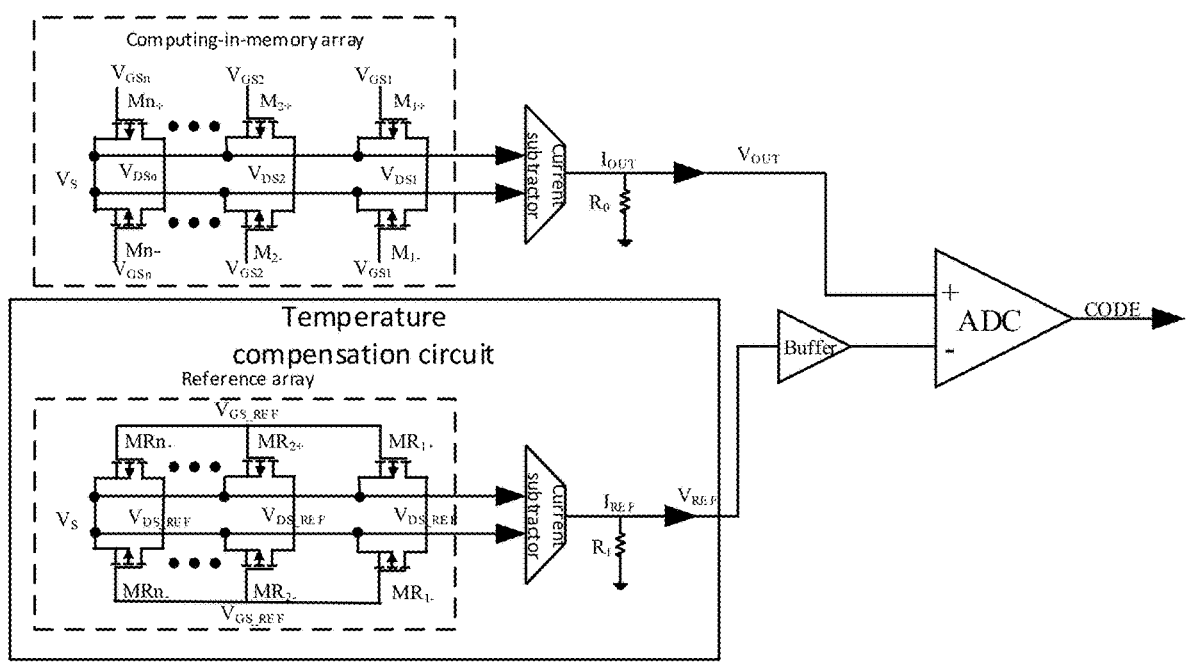
FIG. 4 is a schematic structural diagram of a temperature compensation circuit based on P-type floating-gate devices according to Embodiment II of the disclosure.

This embodiment provides a temperature compensation circuit, configured to perform temperature compensation on a neural network computing-in-memory array composed of P-type floating-gate devices. As shown in FIG. 4, the neural network computing-in-memory array is composed of n P-type floating-gate devices $M_{1+}$-$M_{n+}$ and n P-type floating-gate devices $M_{1-}$-$M_{n-}$. Gates of the n P-type floating-gate devices $M_{1+}$-$M_{n+}$ are respectively to connected to voltages $V_{GS1}$-$V_{GSn}$, drains are respectively connected to input voltages $V_{DS1}$-$V_{DSn}$, and sources are connected with each other and to a fixed voltage $V_S$, and connected into a positive input end of a current subtractor circuit. Gates of the n P-type floating-gate devices $M_{1-}$-$M_{n-}$ are respectively connected to the voltages $V_{GS1}$-$V_{GSn}$, drains are respectively connected to the voltages $V_{DS1}$-$V_{DSn}$, and sources are connected with each other and to the fixed voltage $V_S$, and connected into the negative input end of the current subtractor circuit. The current subtractor circuit is configured to perform a subtraction operation on an input current of the positive input end and an input current of the negative input end. An output end of the current subtractor circuit is connected to one end of the conversion resistor $R_0$ and connected into an input end of the analog-to-digital converter (ADC). The other end of the conversion resistor $R_0$ is grounded.

The temperature compensation circuit includes: a reference array, a current subtractor circuit and an I-V conversion resistor $R_1$. The reference array includes two (one positive and one negative) rows of floating-gate devices. One row of floating-gate devices includes n P-type floating-gate devices $MR_{1+}$-$MR_{n+}$, and the other row of floating-gate devices includes n P-type floating-gate devices $MR_{1-}$-$MR_{n-}$.

In the reference array, gates of the n P-type floating-gate devices $MR_{1+}$-$MR_{n+}$ are connected to a same fixed voltage $V_{GS\_REF}$, drains are connected to a same fixed voltage $V_{DS\_REF}$, and sources are connected with each other and to a fixed voltage $V_S$ and connected into a positive input end of the current subtractor circuit. In the reference array, gates of the n P-type floating-gate devices $MR_{1-}$-$MR_{n-}$ are connected to the same fixed voltage $V_{GS\_REF}$, drains are connected to the same fixed voltage $V_{DS\_REF}$, and sources are connected with each other and to the fixed voltage $V_S$ and connected into a negative input end of the current subtractor circuit. An output end of the subtractor circuit is connected to one end of the resistor $R_1$, and connected through a voltage buffer into a reference end of the ADC. The other end of the resistor $R_1$ is grounded. The resistor $R_1$ has same parameters as an I-V conversion resistor $R_0$ in a readout circuit of the computing-in-memory array.

The disclosure further provides a temperature compensation method for a neural network computing-in-memory array, which is applicable to both the temperature compensation circuit for a computing-in-memory array composed of N-type floating-gate devices and the temperature compensation circuit for a computing-in-memory array composed of P-type floating-gate devices. The method includes the following steps:

Step I: Determine the number and position of reference arrays according to temperature field distribution of the computing-in-memory array in actual work.

If the computing-in-memory arrays in computing-in-memory equipment are located in the same temperature field, then one reference array is arranged in the temperature field. If the temperature field contains a plurality of computing-in-memory arrays, the reference array may be arranged in the middle of all the computing-in-memory arrays, as shown in FIG. 6.

If the computing-in-memory arrays in the computing-in-memory equipment are located in a plurality of temperature fields, then one reference array is arranged for each temperature field.

Step II: Calculate a gate voltage $V_{GS\_REF}$, a drain voltage $V_{DS\_REF}$ and a threshold voltage difference $\Delta V_{THP}$ of floating-gate devices $MR_{1+}$-$MR_{n+}$ and $MR_{1-}$-$MR_{n-}$ in the reference array according to values of a reference voltage and a resistor $R_1$ required by the analog-to-digital converter.

Step III: Input the gate voltage $V_{GS\_REF}$ and the drain voltage $V_{DS\_REF}$ from the outside into gates and drains of the devices according to the calculation result of step II, and regulate a threshold voltage $V_{TH}$ of the devices by programming and erasing operations to obtain the threshold voltage difference $\Delta V_{THP}$ calculated in step II.

Step IV: Enable the reference array to generate a reference current $I_{REF}$ according to the operation of step III; and convert the reference current $I_{REF}$ into the reference voltage $V_{REF}$ of the analog-to-digital converter by the resistor $R_1$.

According to the temperature compensation method of the disclosure, optionally, the reference array and the computing-in-memory array are located in a same temperature field, and the current $I_{REF}$ generated after the operation of the reference array and a current $I_{OUT}$ generated after the operation of the computing-in-memory array change in a same proportion, so that a ratio of the input voltage to the reference voltage of the analog-to-digital converter before and after the temperature change remains unchanged, so as to ensure the correctness of output data of the analog-to-digital converter.

In a non-readout mode, the gate voltage $V_{GS\_REF}$ of all the floating-gate devices in the reference array are connected to VDD, and at this time, no current is output from the reference array.

In a readout mode, the weights stored in the two rows of floating-gate devices in the computing-in-memory array are $\Delta V_{THP1}$-$\Delta V_{THPn}$, the weights stored in the two rows of floating-gate devices in the reference array are all $\Delta V_{THP\_REF}$, and the computing-in-memory array obtains a corresponding output current $I_{OUT}$ through the subtractor circuit:

$$I_{OUT} = \mu_P C_{ox} \frac{W}{L}(\Delta V_{THP1} V_{DS1} + \Delta V_{THP2} V_{DS2} + \ldots + \Delta V_{THPn} V_{DSn}),$$

$\mu_P$ is the mobility of all the P-type floating-gate devices, $C_{ox}$ is the capacitance of the gate oxide layer, and W and L are respectively the width and length of the floating-gate device.

The output current $I_{OUT}$ is subjected to I-V conversion to obtain an output voltage:

$$V_{OUT} = \mu_P C_{ox} \frac{W}{L} R_0 (\Delta V_{THP1} V_{DS1} + \Delta V_{THP2} V_{DS2} + \ldots + \Delta V_{THPn} V_{DSn});$$

The output currents of the positive and negative rows of floating-gate devices in the reference array subjected to subtraction to obtain a reference current:

$$I_{REF} = n\mu_P C_{ox} \frac{W}{L} (\Delta V_{THP\_REF} V_{DS\_REF}),$$

The reference current is subjected to I-V conversion to obtain a reference voltage:

$$V_{REF} = n\mu_P C_{ox} \frac{W}{L} R_1 (\Delta V_{THP\_REF} V_{DS\_REF}),$$

Assuming that the ADC is an m-bit ADC, then the ADC outputs the digital result:

CODE = $V_{OUT}/V_{REF}$) ×

$(2^m - 1) = [(\Delta V_{THN1} V_{DS1} + \Delta V_{THN2} V_{DS2} + \ldots \Delta V_{THNn} V_{DSn})/$ $n(\Delta V_{THN\_REF} V_{DS\_REF})] \times (2^m - 1),$ the formula does not contain any parameter related to temperature characteristic, so that the digital output of the ADC will not change with the temperature. That is, the temperature compensation method in this embodiment eliminates the temperature drift characteristic of the P-type floating-gate devices.

The temperature compensation method of this embodiment is essentially the same as that of Embodiment I and can obtain the same effects, which will not be repeated here.

Embodiment III

Figure 5:
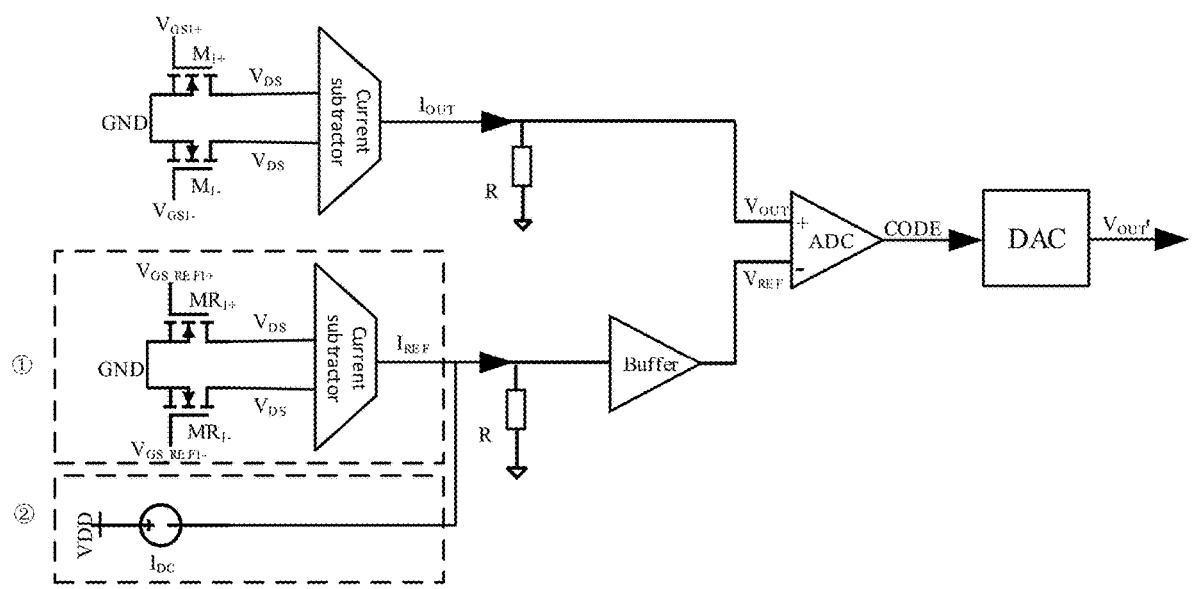
FIG. 5 is a schematic structural diagram of a test circuit according to Embodiment III of the disclosure.

In order to prove the beneficial effects of the compensation method by eliminating the temperature drift characteristic of floating-gate devices in the computing-in-memory array according to the disclosure, a test circuit is built based on the fact that the linear region of an MOS transistor has the same characteristic as the linear region of the floating gate transistor. As shown in FIG. 5, for example, the computing-in-memory array includes 1 NMOS transistor $M_{1+}$ and 1 NMOS transistor $M_{1-}$. Correspondingly, a reference array in the temperature compensation circuit includes 1 NMOS transistor $MR_{1+}$ and 1 NMOS transistor $MR_{1-}$. Drain voltages of $M_{1+}$, $M_1$-, $MR_{1+}$ and $MR_{1-}$ are all $V_{DS}$, source voltages are all connected to ground, and source voltages are respectively $V_{GS1}+$, $V_{GS1-}$, $V_G S2+$ and $V_{GS2-}$. Voltages of $V_{DS}$, $V_{GS1}+$, $V_{GS1}-$, $V_{GS2+}$ and $V_{GS2-}$ are regulated to ensure that all the NMOS transistors are all in the linear region. All the NMOS transistors have a same width W and a same length L, and the mobility is $\mu$.

Currents of the NMOS transistors $M_1+$ and $M_{1-}$ pass through a subtractor circuit to obtain an output current $$I_{OUT} = \mu C_{ox} \frac{W}{L} (V_{GS1+} - V_{GS1-}) V_{DS}, \mu C_{ox} \frac{W}{L} (V_{GS1+} - V_{GS1-})$$

represents the weight of the computing-in-memory array, and $V_{DS}$ represents the input data of the computing-in-memory array. Then, the output current passes through a resistor R to obtain an ADC input voltage $$V_{OUT} = \mu C_{ox} \frac{W}{L} R(V_{GS1+} - V_{GS1-}) V_{DS}.$$

In this embodiment, there are two methods of generating the reference voltage $V_{REF}$ of the ADC. Method (1):

According to the method of generating the reference voltage $V_{REF}$ in the disclosure, currents of the NMOS transistors $MR_{1+}$ and $MR_{1-}$ pass through a subtractor circuit and a resistor R to obtain $$V_{REF} = \mu C_{ox} \frac{W}{L} R(V_{GS2+} - V_{GS2-}) V_{DS}, \mu C_{ox} \frac{W}{L} (V_{GS1+} - V_{GS1-})$$

represents the weight of the reference array, and $V_{DS}$ represents the input data of the reference array.

Method (2): A constant current source $I_{DC}$ and a resistor R are used to generate an ADC reference voltage $V_{REF}$, which is similar to the traditional method of directly inputting the reference voltage from the outside. Finally, an ideal DAC having the same range as the ADC is added after the ADC, so as to convert the digital output of the ADC into an analog output $V_{OUT}'$. The $V_{OUT}'$ is compared with the $V_{OUT}$. The closer $V_{OUT}'$ to $V_{OUT}$, the less the output of the ADC is affected by temperature. In this way, the beneficial effects of the temperature compensation method in the disclosure can be exhibited more visually.

In this embodiment, transient-state simulation of an analog circuit is performed by virtuoso software of Cadence company. $V_{OUT}$ and $V_{OUT}'$ are compared at 25° C. (normal temperature), 0° C. (low temperature) and 100° C. (high temperature) respectively. At 25° C., the parameters R, ($V_{GS}2+-V_{GS}2-$), $V_{DS}$ and IDC are regulated, so that Methods (1) and (2) generate the same reference voltage, and $V_{OUT}'$ at this time serves as the theoretical output. These parameters remain unchanged at other temperatures.

The simulation result at 25° C. is shown in FIG. 6. The horizontal axis is time (T), and the vertical axis is voltage (V). In the diagram, mark point M11 is the ADC input voltage $V_{OUT}$=145.3 mV, mark point M12 is the reference voltage generated by the reference array, mark point M9 is the output of the DAC when Method (1) is used, and mark point M10 is the output of the DAC when Method (2) is used. As can be seen, at this time, the output $V_{OUT}'$ in Method (1) and the output $V_{OUT}'$ in Method (2) are the same, i.e., 144.1 mV.

Figure 7:
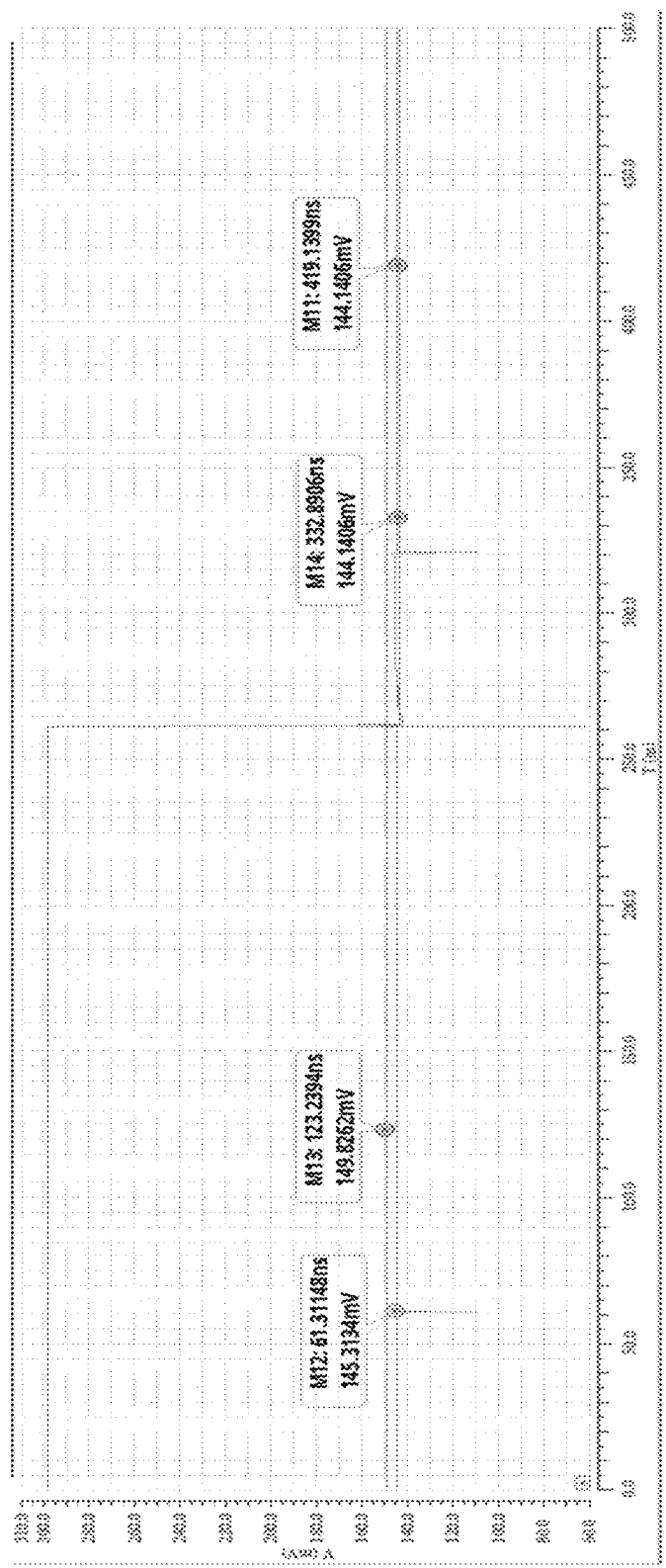
FIG. 7 is a simulation diagram showing a result of the test circuit at 25° C. according to Embodiment III of the disclosure.

The simulation result at 0° C. is shown in FIG. 7. The horizontal axis is time (T), and the vertical axis is voltage (V). In the diagram, mark point M15 is the ADC input voltage, mark point M16 is the reference voltage generated by the reference array, mark point M13 is the output voltage of the DAC when Method (1) is used, and mark point M14 is the output voltage of the DAC when Method (2) is used.

As can be seen, at this time, due to the temperature drift characteristic of mobility, the ADC input voltage $V_{OUT}$ has seriously deviated to 181.4 mV. When Method (1) is used, the reference voltage deviates to 186.8 mV accordingly. At this time, the output voltage $V_{OUT}'$ of the DAC is 144.1 mV, which indicates that the output voltage of the ADC is not affected by the temperature change. When Method (2) is used, the output voltage $V_{OUT}'$ of the DAC has seriously deviated to 180.5 mV, which indicates that the output voltage of the ADC is affected by the temperature change.

Figure 8:
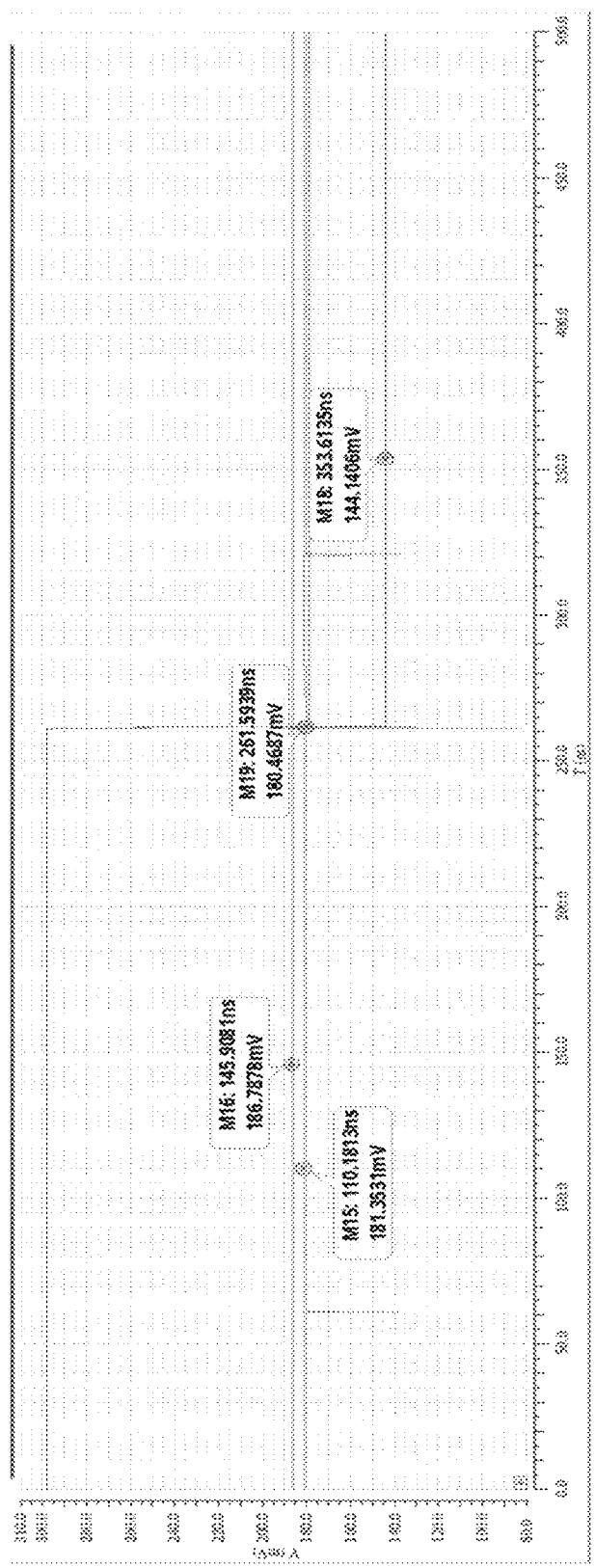
FIG. 8 is a simulation diagram showing a result of the test circuit at 0° C. according to Embodiment III of the disclosure.
Figure 9:
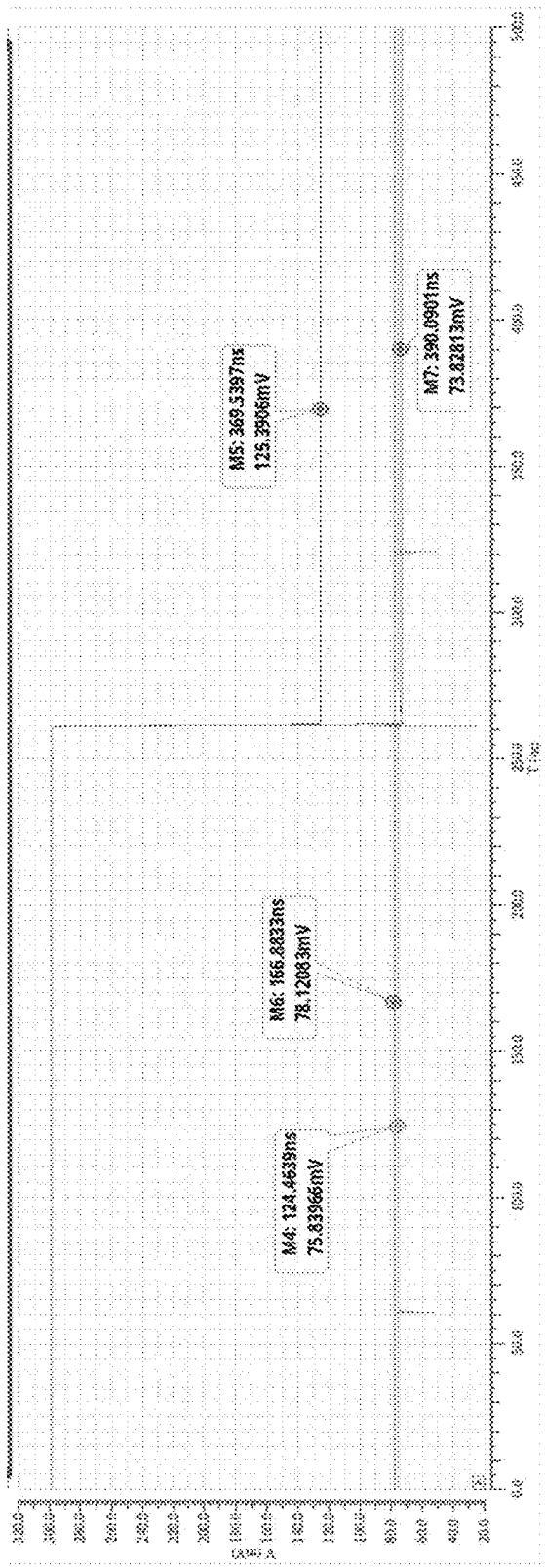
FIG. 9 is a simulation diagram showing a result of the test circuit at 100° C. according to Embodiment III of the disclosure.

The simulation result at 100° C. is shown in FIG. 8. The horizontal axis is time (T), and the vertical axis is voltage (V). In the diagram, mark point M24 is the input voltage of the ADC, mark point M23 is the reference voltage generated by the reference array, mark point M21 is the output voltage of the DAC when Method (1) is used, and mark point M22 is the output voltage of the DAC when Method (2) is used. As can be seen, at this time, due to the temperature drift characteristic of mobility, the input voltage $V_{OUT}$ of the ADC has seriously deviated to 75.8 mV. When Method (1) is used, the reference voltage deviates to 78.1 mV accordingly. At this time, the output voltage $V_{OUT}'$ of the DAC is 125.4 mV. When Method (2) is used, the output voltage $V_{OUT}'$ of the DAC has seriously deviated to 73.8 mV, which indicates that the method of generating the reference voltage by the reference array effectively compensates for the temperature drift characteristic of the mobility.

Analysis on the simulation results: Before the temperature compensation, at 0° C. to 100° C., the temperature coefficient of the digital output of the ADC is up to 0.6%/° C.; and after the temperature compensation, at 0° C. to 100° C., the temperature coefficient of the output of the ADC is down to 0.13%/° C.

Based on the above, the temperature compensation circuit and method by eliminating the temperature drift characteristic of the devices of the computing-in-memory array according to the disclosure have good effects.

Part of steps in the embodiments of the disclosure can be implemented by software, and the corresponding software program can be stored in a readable storage medium, such as an optical disk or a hard disk.

The above description is only the preferred embodiments of the disclosure and is not intended to limit the disclosure. Any modifications, equivalent substitutions and improvements made within the spirit and principles of the disclosure should be included within the protection scope of the disclosure.

What is claimed is:

1. A temperature compensation circuit for a neural network computing-in-memory array, configured to perform temperature compensation on the neural network computing-in-memory array composed of N-type floating-gate devices, wherein the temperature compensation circuit comprises a reference array composed of two rows of N-type floating-gate devices for storing weights, a current subtractor circuit and an I-V conversion resistor $R_1$;

the two rows of N-type floating-gate devices for storing weights respectively comprise n N-type floating-gate devices $MR_{1+}$-$MR_{n+}$ and n N-type floating-gate devices $MR_{1-}$-$MR_{n-}$; in the reference array, gates of the n N-type floating-gate devices $MR_{1+}$-$MR_{n+}$ are connected to a same fixed voltage $V_{GS}$, drains are connected to a same fixed voltage $V_{DS}$, and sources are connected with each other and to a fixed voltage $V_S$ and connected into a positive input end of the current subtractor circuit; in the reference array, gates of the n N-type floating-gate devices $MR_{1-}$ $MR_{n-}$ are connected to the same fixed voltage $V_{GS}$, drains are connected to the same fixed voltage $V_{DS}$, and sources are connected with each other and to the fixed voltage $V_S$ and connected into a negative input end of the current subtractor circuit;

an output end of the subtractor circuit is connected to one end of the I-V conversion resistor $R_1$, and connected through a voltage buffer into a reference end of an analog-to-digital converter (ADC) connected with the computing-in-memory array; the other end of the I-V conversion resistor $R_1$ is grounded; and the I-V conversion resistor $R_1$ has same parameters as an I-V conversion resistor $R_0$ in a readout circuit of the computing-in-memory array.

2. The temperature compensation circuit according to claim 1, wherein the neural network computing-in-memory array is composed of n N-type floating-gate devices $M_{1+}$-$M_{n+}$ and n N-type floating-gate devices $M_{1-}$-$M_{n-}$; the readout circuit of the computing-in-memory array comprises one subtractor circuit, one I-V conversion resistor $R_0$ and the analog-to-digital converter (ADC);

in the neural network computing-in-memory array, gates of the n N-type floating-gate devices $M_{1+}$-$M_{n+}$ are respectively connected to voltages $V_{GS1}$-$V_{GSn}$, drains are respectively connected to input voltages $V_{DS1}$-$V_{DSn}$, and sources are connected with each other and to the fixed voltage $V_S$, and connected into the positive input end of the current subtractor circuit; gates of the n N-type floating-gate devices $M_{1-}$-$M_{n-}$ are respectively connected to the voltages $V_{GS1}$-$V_{GSn}$, drains are respectively connected to the voltages $V_{DS1}$-$V_{DSn}$, and sources are connected with each other and to the fixed voltage $V_S$, and connected into the negative input end of the current subtractor circuit;

an output end of the current subtractor circuit is connected to one end of the I-V conversion resistor $R_0$ and connected into a data input end of the analog-to-digital converter (ADC); the other end of the I-V conversion resistor $R_0$ is grounded; and the current subtractor circuit is configured to perform a subtraction operation on an input current of the positive input end and an input current of the negative input end.

3. A temperature compensation method for a neural network computing-in-memory array, applied to the temperature compensation circuit according to claim 1, the method comprising:

step I: determining the number and position of reference arrays according to temperature field distribution of the computing-in-memory array in actual work;

step II: calculating a gate voltage $V_{GS}$, a drain voltage $V_{DS}$ and a threshold voltage difference $\Delta V_{TH}$ of floating-gate devices $MR_{1+}$-$MR_{n+}$ and $MR_{1-}$-$MR_{n-}$ in the reference array according to values of a reference voltage and an I-V conversion resistor $R_1$ required by the analog-to-digital converter;

step III: inputting the gate voltage $V_{GS}$ and the drain voltage $V_{DS}$ from the outside into gates and drains of the floating-gate devices according to the calculation result of step II, and regulating a threshold voltage $V_{TH}$ of the floating-gate devices to obtain the threshold voltage difference $\Delta V_{TH}$ calculated in step II; and step IV: enabling the reference array to generate a reference current $I_{REF}$ according to the operation of step III; and converting the reference current $I_{REF}$ into the reference voltage $V_{REF}$ of the analog-to-digital converter by the resistor $R_1$.

4. The temperature compensation method according to claim 3, wherein the reference array and the computing-in-memory array are located in a same temperature field, and the reference current $I_{REF}$ generated after the operation of the reference array and a current $I_{OUT}$ generated after the operation of the computing-in-memory array change in a same proportion, so that a ratio of the input voltage to the reference voltage of the analog-to-digital converter before and after the temperature change remains unchanged, so as to ensure the correctness of output data of the analog-to-digital converter.

5. The temperature compensation method according to claim 3, wherein one reference array is adopted to provide the reference voltage for the analog-to-digital converters connected to all the computing-in-memory arrays in the same temperature field.

6. The temperature compensation method according to claim 5, wherein when one reference array is adopted to provide the reference voltage for the analog-to-digital converters connected to all the computing-in-memory arrays in the same temperature field, the reference array is inserted in the middle of all the computing-in-memory arrays in the same temperature field.

7. The temperature compensation method according to claim 3, wherein the reference array generates a constant current to provide the constant reference voltage for the analog-to-digital converter when working normally, and regulates the gate voltage $V_{GS}$ to turn off the devices in the reference array when not working.

8. The temperature compensation method according to claim 3, wherein the reference array in the same temperature field as the computing-in-memory arrays is adopted to provide the reference voltage for the analog-to-digital converters connected to the computing-in-memory arrays, so as to compensate for temperature drift characteristics of mobility of the N-type or P-type floating-gate devices in the computing-in-memory arrays.

9. A temperature compensation circuit for a neural network computing-in-memory array, configured to perform temperature compensation on the neural network computing-in-memory array composed of P-type floating-gate devices, wherein the temperature compensation circuit comprises a reference array composed of two rows of P-type floating-gate devices for storing weights, a current subtractor circuit and an I-V conversion resistor $R_1$;

the two rows of P-type floating-gate devices for storing weights respectively comprise n P-type floating-gate devices $MR_{1+}$-$MR_{n+}$ and n P-type floating-gate devices $MR_{1-}$-$MR_{n-}$; in the reference array, gates of the n P-type floating-gate devices $MR_{1+}$-$MR_{n+}$ are connected to a same fixed voltage $V_{GS}$, drains are connected to a same fixed voltage $V_{DS}$, and sources are connected with each other and to a fixed voltage $V_S$ and connected into a positive input end of the current subtractor circuit; in the reference array, gates of the n P-type floating-gate devices $MR_{1-}$ $MR_{n-}$ are connected to the same fixed voltage $V_{GS}$, drains are connected to the same fixed voltage $V_{DS}$, and sources are connected with each other and to the fixed voltage $V_S$ and connected into a negative input end of the current subtractor circuit;

an output end of the subtractor circuit is connected to one end of the I-V conversion resistor $R_1$, and connected through a voltage buffer into a reference end of the analog-to-digital converter connected with the computing-in-memory array; the other end of the I-V conversion resistor $R_1$ is grounded; and the I-V conversion resistor $R_1$ has same parameters as an I-V conversion resistor $R_0$ in a readout circuit of the computing-in-memory array.

10. The temperature compensation circuit according to claim 9, wherein the neural network computing-in-memory array is composed of n P-type floating-gate devices $M_{1+}$-$M_{n+}$ and n P-type floating-gate devices $M_{1-}$-$M_{n-}$; the readout circuit of the computing-in-memory array comprises one subtractor circuit, one I-V conversion resistor $R_0$ and the analog-to-digital converter (ADC);

in the neural network computing-in-memory array, gates of the n P-type floating-gate devices $M_{1+}$-$M_{n+}$ are respectively connected to voltages $V_{GS1}$-$V_{GSn}$, drains are respectively connected to input voltages $V_{DS1}$-$V_{DSn}$, and sources are connected with each other and to the fixed voltage $V_S$, and connected into the positive input end of the current subtractor circuit; gates of the n P-type floating-gate devices $M_{1-}$-$M_{n-}$ are respectively connected to the voltages $V_{GS1}$-$V_{GSn}$, drains are respectively connected to the voltages $V_{DS1}$-$V_{DSn}$, and sources are connected with each other and to the fixed voltage $V_S$, and connected into the negative input end of the current subtractor circuit;

an output end of the current subtractor circuit is connected to one end of the conversion resistor $R_0$ and connected into a data input end of the analog-to-digital converter (ADC); the other end of the conversion resistor $R_0$ is grounded; and the current subtractor circuit is configured to perform a subtraction operation on an input current of the positive input end and an input current of the negative input end.

\* \* \* \* \*